(12) United States Patent
Talalaevsky et al.

(10) Patent No.: US 10,944,147 B2
(45) Date of Patent: Mar. 9, 2021

(54) THIN FILM SURFACE MOUNTABLE HIGH FREQUENCY COUPLER

(71) Applicant: AVX Corporation, Fountain Inn, SC (US)

(72) Inventors: Arie Leonid Talalaevsky, Jerusalem (IL); Michael Marek, Jerusalem (IL); Elinor O'Neill, Mevaseret Zion (LI)

(73) Assignee: AVX Corporation, Fountain Inn, SC (US)

(*) Notice: Subject to any disclaimer, the term of this patent is extended or adjusted under 35 U.S.C. 154(b) by 0 days.

(21) Appl. No.: 16/287,089

(22) Filed: Feb. 27, 2019

(65) Prior Publication Data

US 2019/0280361 A1 Sep. 12, 2019

Related U.S. Application Data

(60) Provisional application No. 62/639,309, filed on Mar. 6, 2018, provisional application No. 62/642,219, filed on Mar. 13, 2018.

(51) Int. Cl.
*H01P 5/12* (2006.01)
*H01P 3/08* (2006.01)
(Continued)

(52) U.S. Cl.
CPC ............... *H01P 5/12* (2013.01); *H01P 3/081* (2013.01); *H05K 1/0237* (2013.01); *H05K 1/115* (2013.01);
(Continued)

(58) Field of Classification Search
CPC ...... H01P 5/18; H01P 5/184–187; H01P 5/12; H01P 3/081; H05K 1/0237; H05K 1/115
(Continued)

(56) References Cited

U.S. PATENT DOCUMENTS

| 4,150,345 A | 4/1979 | Goldman et al. |
| 5,111,165 A | 5/1992 | Oldfield |

(Continued)

FOREIGN PATENT DOCUMENTS

| CN | 87212936 U | 9/1988 |
| CN | 205407834 U | 7/2016 |

(Continued)

OTHER PUBLICATIONS

"Evolution to 5G Microwave Products," Knowles, 2017, 8 pages.
(Continued)

*Primary Examiner* — Dean O Takaoka
(74) *Attorney, Agent, or Firm* — Dority & Manning, P.A.

(57) ABSTRACT

A high frequency coupler is disclosed that is configured for grid array-type surface mounting. The coupler includes a monolithic base substrate having a top surface and a bottom surface. A first thin film microstrip and a second thin film microstrip are each disposed on the top surface of the monolithic base substrate. Each microstrip has an input end and an output end. At least one via extends through the monolithic base substrate from the top surface to the bottom surface of the monolithic base substrate. The via(s) are electrically connected with at least one of the input end or the output end of the first microstrip or the second microstrip. The coupler has a coupling factor that is greater than about −30 dB at about 28 GHz.

24 Claims, 11 Drawing Sheets

(51) Int. Cl.
*H05K 1/11* (2006.01)
*H05K 1/02* (2006.01)
*H01P 5/18* (2006.01)
*H04W 88/08* (2009.01)

(52) U.S. Cl.
CPC ... *H04W 88/08* (2013.01); *H05K 2201/10098* (2013.01)

(58) Field of Classification Search
USPC .......................................... 333/109–112, 116
See application file for complete search history.

(56) References Cited

U.S. PATENT DOCUMENTS

| | | |
|---|---|---|
| 5,619,172 A | 4/1997 | Reynolds |
| 5,689,217 A * | 11/1997 | Gu .......................... H01P 5/187 333/116 |
| 5,742,213 A | 4/1998 | Reynolds |
| 5,757,252 A | 5/1998 | Cho et al. |
| 6,023,210 A | 2/2000 | Tulinsteff |
| 6,099,677 A * | 8/2000 | Logothetis .............. H01L 23/66 156/253 |
| 6,144,268 A | 11/2000 | Matsui et al. |
| 6,342,681 B1 | 1/2002 | Goldberger et al. |
| 6,542,375 B1 | 4/2003 | Kuitenbrouwer et al. |
| 7,084,715 B2 | 8/2006 | Al-Taei et al. |
| 7,714,598 B2 | 5/2010 | Eldridge et al. |
| 7,795,994 B2 | 9/2010 | Radtke |
| 7,876,174 B2 | 1/2011 | Radtke |
| 8,897,697 B1 | 11/2014 | Bennett et al. |
| 9,042,812 B1 | 5/2015 | Bennett et al. |
| 9,154,966 B2 | 10/2015 | Bennett et al. |
| 9,467,870 B2 | 10/2016 | Bennett et al. |
| 9,660,345 B1 | 5/2017 | Gu et al. |
| 9,661,505 B2 | 5/2017 | Bennett et al. |
| 9,674,711 B2 | 6/2017 | Bennett et al. |
| 9,755,609 B2 | 9/2017 | Korony et al. |
| 9,831,558 B1 | 11/2017 | Gu et al. |
| 9,875,264 B2 | 1/2018 | Barnickel et al. |
| 9,877,209 B2 | 1/2018 | Bennett et al. |
| 9,882,607 B2 | 1/2018 | Bennett et al. |
| 10,056,182 B2 | 8/2018 | Murtagian et al. |
| 10,098,011 B2 | 10/2018 | Bennett et al. |
| 10,224,590 B2 | 3/2019 | Barnickel et al. |
| 2004/0207482 A1* | 10/2004 | McAndrew ............. H01P 5/185 333/116 |
| 2009/0085726 A1 | 4/2009 | Radtke |
| 2010/0117908 A2 | 5/2010 | Lee et al. |
| 2010/0148885 A1* | 6/2010 | Tzuang ..................... H01P 3/08 333/116 |
| 2014/0167900 A1 | 6/2014 | Murtagian et al. |
| 2016/0028146 A1* | 1/2016 | Zhang ..................... H01P 5/184 333/112 |
| 2017/0110778 A1* | 4/2017 | DeWitt ................. H01L 23/481 |
| 2019/0075470 A1 | 3/2019 | Bennett et al. |

FOREIGN PATENT DOCUMENTS

| | | | |
|---|---|---|---|
| CN | 106354951 A | | 1/2017 |
| CN | 108631036 A | * | 10/2018 |
| GB | 1 370 647 | | 10/1974 |
| JP | H 07326517 A | | 12/1995 |
| JP | 2001155923 A | | 6/2001 |
| JP | 2008099064 A | | 4/2008 |
| KR | 20130135549 A | | 12/2013 |
| KR | 20160096532 A | | 8/2016 |
| WO | WO 2017/058491 A1 | | 4/2017 |

OTHER PUBLICATIONS

Caspers, F., "RF engineering basic concepts: S-parameters," CERN Yellow Report CERN-2011-007, Jan. 11, 2012, pp. 67-93.

Mamdouh, et al., "Printed Ridge Gap Waveguide 3-dB Coupler: Analysis and Design Procedure," IEEE Access, vol. 6, 2018, pp. 8501-8509.

Sajin et al., "Metamaterial Millimeter Wave Directional Coupler on Silicon Substrate," Oct. 2010, pp. 269-272.

International Search Report and Written Opinion for PCT/US2019/019762 dated Jun. 12, 2019, 13 pages.

* cited by examiner

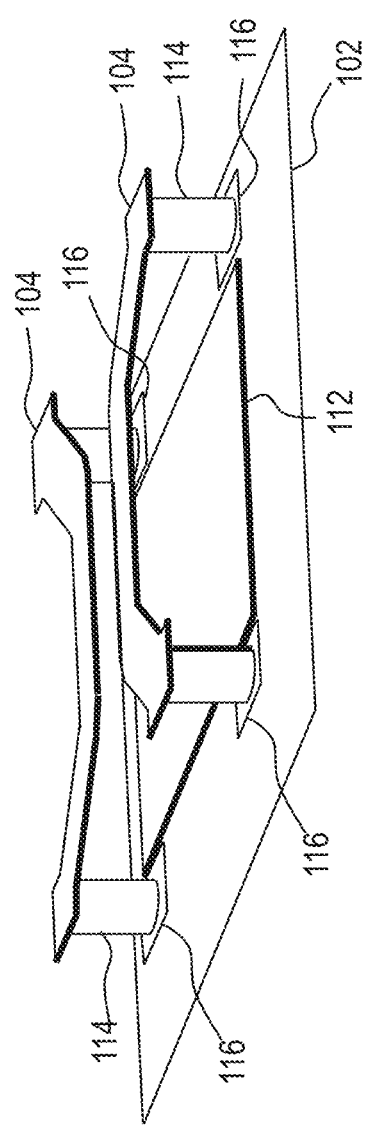

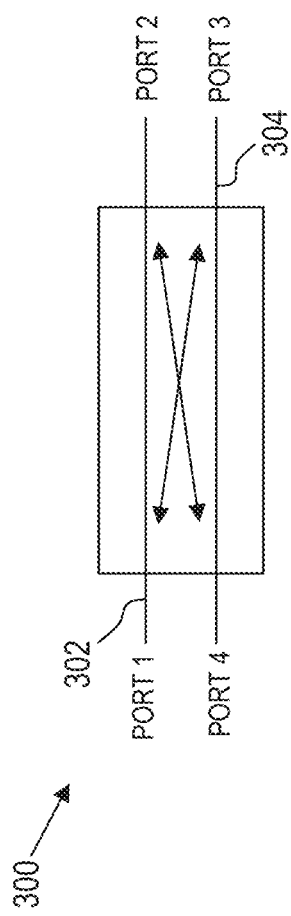

THIN FILM SURFACE MOUNTABLE HIGH FREQUENCY COUPLER

CROSS REFERENCE TO RELATED APPLICATIONS

The present application claims filing benefit of U.S. Provisional Patent Application Ser. Nos. 62/639,309 having a filing date of Mar. 6, 2018 and 62/642,219 having a filing date of Mar. 13, 2018, which are incorporated herein by reference in their entirety.

BACKGROUND OF THE INVENTION

High frequency radio signal communication has increased in popularity. For example, the demand for increased data transmission speed for wireless smartphone connectivity has driven demand for high frequency components, including those configured to operate at 5G spectrum frequencies. A trend towards miniaturization has also increased the desirability of small, passive components for handling such high frequency signals. Miniaturization has also increased the difficulty of surface mounting small, passive components suitable for operation in the 5G frequency spectrum. A compact, high frequency coupler that is easily surface mounted would be welcomed in the art.

SUMMARY

In accordance with one embodiment of the present invention, a high frequency, surface mountable coupler is disclosed. The coupler includes a monolithic base substrate having a top surface, a bottom surface, a length in a longitudinal direction, and a width in a lateral direction that is perpendicular to the longitudinal direction. The coupler includes a first thin film microstrip disposed on the top surface of the monolithic base substrate. The first microstrip has an input end and an output end. The coupler includes a second thin film microstrip disposed on the top surface of the monolithic base substrate. The second microstrip has an input end and an output end. The coupler includes at least one via extending through the monolithic base substrate from the top surface to the bottom surface of the monolithic base substrate. The via(s) are electrically connected with at least one of the input end or the output end of the first microstrip or the second microstrip. The coupler has a coupling factor that is greater than about −30 dB at about 28 GHz.

In accordance with another aspect of the present invention, a method for forming a high frequency, surface mountable coupler is disclosed. The method includes forming at least one via through hole that extends from a top surface of a monolithic base substrate to a bottom surface of the monolithic base substrate. The method includes depositing each of a first thin film microstrip and a second thin film microstrip on the top surface of the monolithic base substrate. Each of the first and second thin film microstrips are sized and spaced apart such that the coupler has a coupling factor that is greater than about −30 dB at about 28 GHz. The method includes depositing a conductive via material inside the via through hole(s) to form at least one via electrically connecting at least one of the first thin film microstrip or the second thin film microstrip with a contact pad on the bottom surface of the monolithic base substrate.

In accordance with another aspect of the present invention, a high frequency, surface mountable coupler is disclosed. The coupler includes a monolithic base substrate having a top surface, a bottom surface, a length in a longitudinal direction, a width in a lateral direction that is perpendicular to the longitudinal direction, and a thickness in a Z direction that is perpendicular to each of the longitudinal direction and the lateral direction. The coupler includes a first thin film microstrip disposed on the top surface of the monolithic base substrate. The first microstrip has an input end and an output end. A second thin film microstrip is disposed on the top surface of the monolithic base substrate, and the second microstrip has an input end and an output end. At least a portion of the first thin film microstrip and at least a portion of the second thin film microstrip extend parallel to each other in a first direction along a coupling length that ranges from about 0.2 mm to about 3.8 mm.

In accordance with another aspect of the present invention, a base station circuit is disclosed. The base station circuit includes a signal source component and a high frequency, surface mountable coupler operatively connected with the signal source component. The coupler includes a monolithic base substrate having a top surface, a bottom surface, a length in a longitudinal direction, and a width in a lateral direction that is perpendicular to the longitudinal direction. The coupler includes a first thin film microstrip disposed on the top surface of the monolithic base substrate. The first microstrip having an input end and an output end. The coupler includes a second thin film microstrip disposed on the top surface of the monolithic base substrate. The second microstrip has an input end and an output end. At least one via extends through the monolithic base substrate from the top surface to the bottom surface of the monolithic base substrate. The via(s) are electrically connected with at least one of the input end or the output end of the first microstrip or the second microstrip. The coupler has a coupling factor that is greater than about −30 dB at about 28 GHz.

BRIEF DESCRIPTION OF THE DRAWINGS

A full and enabling disclosure of the present invention, including the best mode thereof, directed to one of ordinary skill in the art, is set forth in the specification, which makes reference to the appended Figures, in which:

FIGS. 2A and 2B illustrate perspective views of the embodiment of the thin film coupler illustrated in FIGS. 1A and 1B;

FIG. 6A illustrates a simplified, schematic view of an embodiment of a coupler having a transmission line and a coupled line.

Figure 1A:
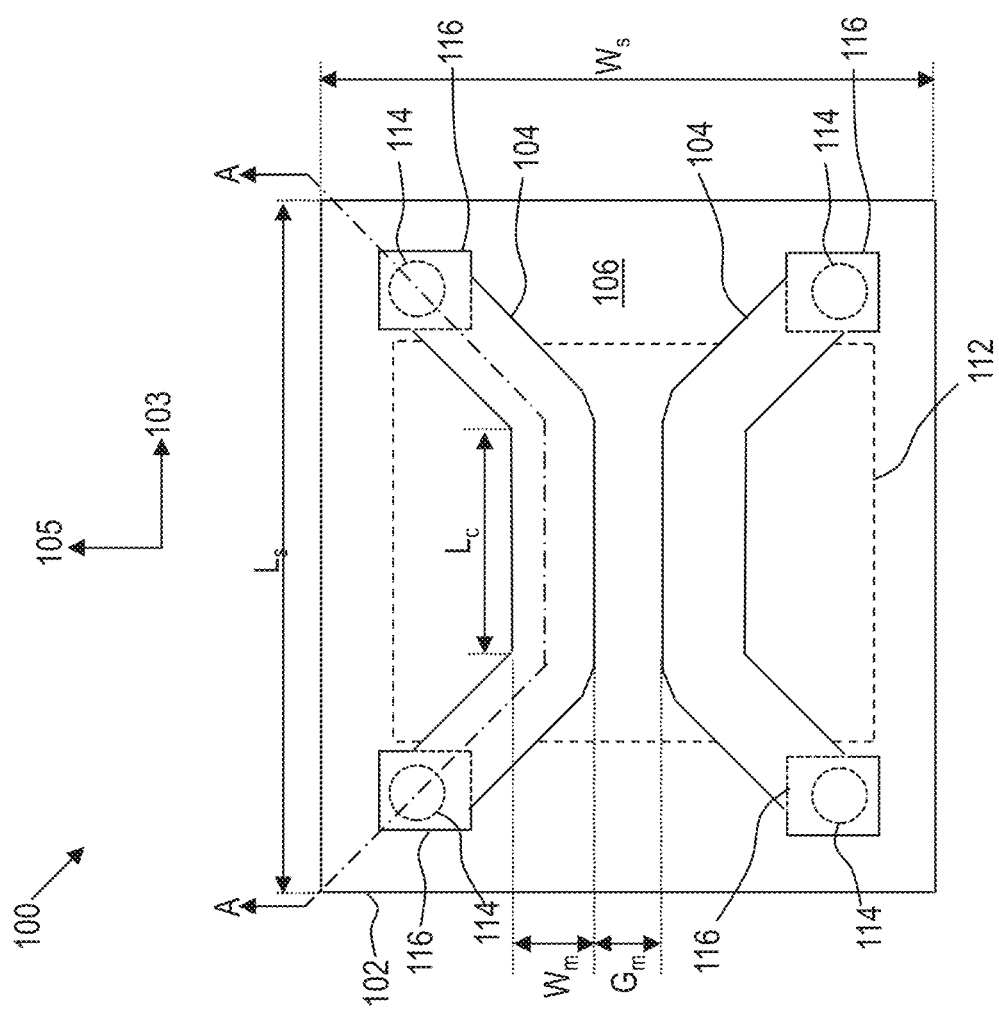
FIG. 1A illustrates a top down view of one embodiment of a thin film coupler in accordance with aspects of the present disclosure.

Repeat use of reference characters throughout the present specification and appended drawings is intended to represent same or analogous features or elements of the invention.

DETAILED DESCRIPTION OF REPRESENTATIVE EMBODIMENTS

A surface mountable coupler device is provided that is particularly useful in high frequency circuits, including those operating in the 5G frequency spectrum. The 5G frequency spectrum generally extends from about 20 GHz to about 30 GHz. Couplers generally provide coupling between two signal lines without direct electrical contact. Exemplary uses include radio frequency (RF) mixers, amplifiers, and modulators. For instance, couplers may be used to provide coupling for a feedback control loop or an amplifier output section in a RF transmitter.

A thin film coupler may be formed on one or more monolithic substrates. For example, in some embodiments, the thin film coupler may include a base substrate and a cover substrate. The substrate(s) may comprise one or more suitable ceramic materials. Suitable materials are generally electrically insulating and thermally conductive. For example, in some embodiments, the substrate may comprise alumina ($Al_2O_3$), aluminum nitride (AlN), beryllium oxide (BeO), aluminum oxide ($Al_2O_3$), boron nitride (BN), silicon (Si), silicon carbide (SiC), silica ($SiO_2$), silicon nitride ($Si_3N_4$), gallium arsenide (GaAs), gallium nitride (GaN), zirconium dioxide ($ZrO_2$), mixtures thereof, oxides and/or nitrides of such materials, or any other suitable ceramic material. Additional ceramic materials include barium titanate ($BaTiO_3$), calcium titanate ($CaTiO_3$), zinc oxide (ZnO), ceramics containing low-fire glass, and other glass-bonded materials.

In some embodiments, one or more of the substrates may comprise sapphire or ruby. Sapphire and ruby are types of corundum, which is a crystalline form of aluminum oxide (a ceramic material) containing additional trace materials. A substrate comprising sapphire may provide several benefits including excellent electrical insulation, heat dissipation, and high temperature stability. Additionally, because sapphire is generally transparent, internal features of the coupler may be visually inspected, reducing the time and difficulty associated with checking completed components for quality.

The coupler may include various thin film components, including a pair of microstrips formed on a top surface of the base substrate and a base ground plane formed on a bottom surface of the base substrate. In some embodiments, the coupler may also include an additional thin film ground plane disposed on a top surface of the cover substrate. The cover substrate may be arranged on the top surface of the base substrate.

The thin film components may have thicknesses of about 50 micrometers or less, in some embodiments 20 micrometers or less, and in some embodiments 5 micrometers or less. For example, in some embodiments the thickness of the thin film components may range from about 0.05 micrometers to about 50 micrometers, in some embodiments from about 0.1 micrometers to about 20 micrometers, in some embodiments from about 1 micrometer to about 5 micrometers, e.g., about 3 micrometers.

The thin film components may be precisely formed using a variety of suitable subtractive, semi-additive, or fully additive processes. For example, physical vapor deposition and/or chemical deposition may be used. For instance, in some embodiments, the thin film components may be formed using sputtering, a type of physical vapor deposition. A variety of other suitable processes may be used, however, including plasma-enhanced chemical vapor deposition (PECVD) and electroless plating, for example. Lithography masks and etching may be used to produce the desired shape of the thin film components. A variety of suitable etching techniques may be used including dry etching using a plasma of a reactive gas (e.g., oxygen, chlorine, boron trichloride) and/or wet etching.

The thin film components may be formed from a variety of suitable electrically conductive materials. Example materials include copper, nickel, gold, tin, lead, palladium, silver, and alloys thereof. Any conductive metallic or non-metallic material that is suitable for thin film fabrication may be used, however.

Vias may connect the microstrips on the top surface of the base substrate with contact pads on the bottom surface of the base substrate. This may allow the thin film coupler to be surface mounted to a printed circuit board (PCB), for example. In some embodiments, the vias may be formed by laser drilling holes through the base substrate and then filling (e.g., sputtering, electroless plating) the internal surfaces of the holes with a suitable conductive material. In some embodiments, the through holes for the vias may be filled concurrently with the performance of another manufacturing step. For example, the vias may be drilled before the thin film components are formed such that both the vias and the thin film components may be simultaneously deposited. The vias may be formed from a variety of suitable materials including those described above with reference to the thin film components (e.g., microstrips and ground plane).

In some embodiments, one or more protective layers may be exposed along an exterior of the coupler. For example, the protective layer(s) may be formed over a top surface and/or a bottom surface of the coupler. As used herein, "formed over," may refer to a layer that is directly in contact with another layer. However, intermediate layers may also be formed therebetween. Additionally, when used in reference to a bottom surface, "formed over" may be used relative to an exterior surface of the component. Thus, a layer that is "formed over" a bottom surface may be closer to the exterior of the component than the layer over which it is formed.

A top protective layer may be formed over the top surface of base substrate and microstrips or over a top surface of the cover substrate (if present). A bottom protective layer may be exposed along a bottom surface of the coupler, for example formed over the bottom surface of the base substrate. The bottom protective layer may be formed using photolithography techniques in a manner that leaves openings or windows through which the contact pads may be deposited, for example by electroplating.

The protective layer(s) may include a polymeric material, such as polyimide, SiNO, Al2O3, SiO2, Si3N4, benzocyclobutene, or glass. In such embodiments, the protective layer may have a thickness that ranges from about 1 micron to about 300 microns.

The thin film coupler may be configured to be surface mounted on a base surface, such as printed circuit board (PCB), such that the bottom surface of the base substrate is connected with the PCB. Specifically, the thin film coupler may be configured for grid array-type surface mounting. For example, the thin film coupler may be configured for land grid array (LGA) type mounting, ball grid array (BGA) type mounting, or any other suitable type of grid array-type surface mounting.

Regardless of the particular configuration, the present inventors have discovered that through the selective control of the production of the thin film components and vias, a high frequency coupler can be achieved that has a coupling factor that is greater than about −30 dB at about 28 GHz and that is suitable for grid array mounting. For example, in some embodiments, the coupling factor may be greater than about −25 dB at about 28 GHz, and in some embodiments greater than about −20 dB at about 28 GHz, e.g., −19.9 dB.

The coupler may also be suitable for coupling across a broad range of high frequencies. For example, coupler may have a coupling factor that is greater than about −35 dB from about 18 GHz to about 32 GHz, or higher, in some embodiments, greater than about −30 dB from about 18 GHz to about 32 GHz, and in some embodiments greater than about −25 dB from about 18 GHz to about 32 GHz. Additionally, in some embodiments, the coupler may have a coupling factor that is greater than about −35 dB from about 10 GHz to about 70 GHz, in some embodiments, greater than about −30 dB from about 10 GHz to about 70 GHz, and in some embodiments greater than about −25 dB from about 10 GHz to about 70 GHz.

Additional performance characteristics of the coupler may be desirable, including the return loss, insertion loss, and isolation factor. For example, coupler may have a low return loss, which is desirable because return loss represents the portion of the signal that is reflected back by the coupler. In some embodiments, the return loss may be less than −15 dB from about 10 GHz to about 70 GHz, in some embodiments less than about −20 dB from about 20 GHz to about 32 GHz, in some embodiments less than about −25 dB from about 21 GHz to about 32 GHz, and in some embodiments less than about −30 dB from about 22 GHz to about 32 GHz. In some embodiments, the return loss may be less than about −35 dB at about 28 GHz.

The coupler may have an insertion loss that is near zero, which indicates that the signal is passed through a transmission line of the coupler without being substantially affected. The insertion loss may be greater than about −1 dB from about 18 GHz to about 32 GHz, in some embodiments greater than about −0.75 dB from about 18 GHz to about 32 GHz, and in some embodiments greater than about −0.6 dB from about 18 GHz to about 32 GHz. In some embodiments, the insertion loss may be greater than about −1 dB from about 10 GHz to about 70 GHz, in some embodiments greater than about −0.75 dB from about 10 GHz to about 70 GHz, and in some embodiments greater than about −0.6 dB from about 10 GHz to about 70 GHz.

The coupler may also have an isolation factor that is less than about −25 dB from about 18 GHz to about 32 GHz, in some embodiments less than about −30 dB from about 18 GHz to about 32 GHz. Additionally, in some embodiments, the coupler may have an isolation factor that is less than about −25 dB from about 10 GHz to about 70 GHz, in some embodiments less than about −30 dB from about 10 GHz to about 70 GHz. In some embodiments, the isolation factor may be less than about −35 dB at about 28 GHz, in some embodiments less than about −40 dB at about 28 GHz, in some embodiments less than about −45 dB at about 28 GHz.

The coupler includes a pair of microstrips disposed on a top surface of a base substrate. At least a portion of the microstrips may be arranged substantially parallel to each other along a coupling length. The coupling length may be selected to obtain the desired performance characteristics of the coupler, including the coupling factor. Without being bound by theory, the performance characteristics of the coupler may generally be optimized when the coupling length is equal to or proportional to (e.g., a multiple of) λ/4, where λ is wavelength of a desired operating frequency of the coupler propagating through the base substrate and/or cover substrate. A coupling length of the microstrips may be equal to or proportional to λ/4. Additionally, the length(s) of the via(s) may be equal to or proportional to λ/4.

The wavelength, λ, through a material having a dielectric constant, $\varepsilon_r$, can be calculated as follows:

$$\lambda = \frac{C}{f\sqrt{\varepsilon_r}}$$

where C represents the speed of light in a vacuum, and f represents frequency.

In some embodiments, the dielectric constant of the base substrate material and/or cover substrate material may range from about 0.1 to about 50 as determined in accordance with ASTM D2520-13 at an operating temperature of 25° C. and frequency of 28 GHz, in some embodiments from about 0.5 to about 20, in some embodiments from about 1 to about 20, and in some embodiments from about 5 to about 15, e.g., about 9.

In some embodiments, the coupling length may range from about 0.1 mm to about 3.8 mm, in some embodiments from about 0.2 mm to about 3 mm, in some embodiments from about 0.3 mm to about 2.8 mm, and in some embodiments from about 0.3 mm to about 1.5 mm. For example, in some embodiments, the coupling length may be approximately equal to 0.9 mm, corresponding to λ/4 for about 28 GHz and a dielectric material having a dielectric constant of about 9 as determined in accordance with ASTM D2520-13 at an operating temperature of 25° C. and frequency of 28 GHz.

The parallel portions of the microstrips may be spaced apart by a gap distance. The gap distance may be selected to obtain the desired performance characteristics of the coupler e.g., (desired impedance) and the specific component materials implemented. The gap distance may range from about 50 micrometers (μm) to about 750 μm, in some embodiments from about 100 μm to about 700 μm, in some embodiments from about 300 μm to about 600 μm, e.g., 200 μm.

The microstrips may also have a width ranging from about 50 μm to about 500 μm, in some embodiments from about 100 μm to about 400 μm, in some embodiments from about 200 μm to about 300 μm, e.g., about 250 μm.

The micostrips may be shielded by one or more ground planes. The ground plane(s) (e.g., base ground plane and/or cover ground plane) may be substantially parallel to the microstrips and spaced apart by the thicknesses of the substrate(s) (e.g., the base substrate and/or cover substrate). The thicknesses of the substrates may range from about 50 μm to about 500 μm, in some embodiments from about 100 μm to about 400 μm, in some embodiments from about 200 μm to about 300 μm, e.g., about 250 μm. In some embodiments, the thicknesses of the substrate(s) may be selected to be approximately equal to the width of the microstrips.

The vias may also be configured to contribute to the excellent coupling characteristics of the coupler. The vias may connect respective ends of the microstrips (e.g., on the top surface of the base substrate) with respective contact pads (e.g., on the bottom surface of the base substrate). As noted above, the vias may be formed through the base substrate. Thus, the lengths of the vias may be equal to the thickness of the base substrate. The lengths of the vias may be selected to be equal or proportional to $\lambda/4$, which may contribute to the excellent coupling characteristics of the coupler.

In some embodiments, the coupler may include at least one adhesion layer in contact with the thin-film microstrips. The adhesion layer may be or include a variety of materials that are suitable for improving adhesion between the thin-film microstrips and adjacent layers, such as the base substrate, cover substrate, and/or protective layer (e.g., polymeric layer). As examples, the adhesion layer may include at least one of Ta, Cr, TaN, TiW, Ti, or TiN. For instance, the adhesive layer may be or include tantalum (Ta) (e.g., tantalum or an oxide or nitride thereof). Without being bound by theory, the material of the adhesion layer may be selected to overcome phenomena such as lattice mismatch and residual stresses.

The adhesion layer(s) may have a variety of suitable thicknesses. For example, in some embodiments, the thicknesses of the adhesion layer(s) may range from about 100 angstroms to about 1000 angstroms, in some embodiments from about 200 angstroms to about 800 angstroms, in some embodiments from about 400 angstroms to about 600 angstroms.

The coupler may have a compact form. For example, in some embodiments, each of a length and a width of the coupler may be less than about 5.0 mm, in some embodiments less than about 3.5 mm, and in some embodiments less than about 2.5 mm. For example, in some embodiments each of the length and width of the coupler may range from about 0.5 mm to about 5 mm, in some embodiments from about 1 mm to about 4 mm, and in some embodiments from about 2.5 mm to about 3.5 mm.

Despite the compact form of the coupler, in some embodiments, the coupler may be configured for grid array type mounting. For example, vias may facilitate grid array type mounting of the coupler to a PCB. Exemplary types of grid array mounting include ball grid array and land grid array. For example, in some embodiments, the vias may be electrically connected with respective contact pads disposed on a bottom surface of the coupler. A base ground plane may also be disposed on the bottom surface of the coupler. The contact pads and base ground plane may provide electrical connections on the bottom surface of the base substrate such that the coupler may be surface mounted using grid array type mounting.

Grid array type mounting may provide significant advantages. For example, mounting the coupler to a PCB may be performed more efficiently, reducing assembly cost. Additionally, manufacturing costs associated with forming the high frequency surface mountable coupler may be reduced compared with alternative mounting options. In some embodiments, the described configuration may also protect electrical contacts (e.g., contact pads and base ground plane) from electrically shorting because all electrical contacts may be obscured and protected underneath the coupler or underneath the cover substrate. Additionally, the base ground plane may provide for attachment along a significant portion of the total area of the coupler. This may result in a more robust physical connection between the coupler and the PCB.

Figure 1B:
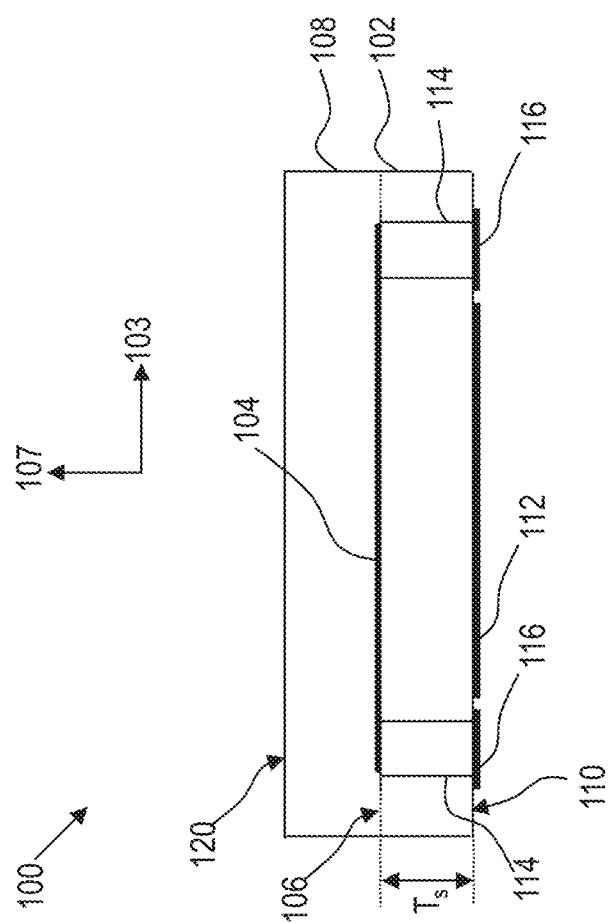
FIG. 1B illustrates a cross section view along section A-A in FIG. 1A.

FIG. 1A illustrates a top down view of one embodiment of a thin film coupler 100 in accordance with aspects of the present disclosure. FIG. 1B illustrates a cross section view along section A-A in FIG. 1A. The thin film coupler 100 may include a base substrate 102 and a pair of microstrips 104. The base substrate may have a top surface 106, and the microstrips 104 may be formed on the top surface 106 of the base substrate 102. The base substrate 102 may also have a length (represented by $L_s$ in FIG. 1A) in a longitudinal direction 103, and a width (represented by $W_s$ in FIG. 1A) in a lateral direction 105 that is perpendicular to the longitudinal direction 103. The base substrate 102 may also have a thickness (represented by $T_s$ in FIG. 1A) in a Z direction 107 that is perpendicular to each of the longitudinal direction 103 and the lateral direction 105.

One of the microstrips 104 may function as a transmission line, and the other of the microstrips 104 may function as a coupled line. At least a portion of the microstrips 104 may be arranged substantially parallel to each other along a coupling length (represented by $L_c$ in FIG. 1A). In some embodiments, the coupling length, $L_c$, may be proportional to $\lambda/4$, where $\lambda$ represents the desired operating frequency of the coupler. The microstrips 104 may also have a width (represented by $W_m$ in FIG. 1A). The microstrips 104 may be arranged such that a gap (represented by $G_m$ in FIG. 1A) is formed between the microstrips 104. The electromagnetic interaction between the microstrips 104 may cause a signal through one of the microstrips 104 (the transmission line) to induce a signal in the other of the microstrips 104 (the coupled line).

A cover substrate 108 may overlay each of the top surface 106 of the base substrate 102 and the microstrips 104 that are formed on the top surface 106. The cover substrate 108 is omitted from FIG. 1A for clarity such that the top surface 106 of the base substrate 102 is visible. The cover substrate 108 is visible in FIG. 1B, however. The cover substrate 108 may protect the microstrips 104 from electrical short by contact with other electrically conductive objects. The cover substrate 108 may further protect the microstrips 104 from damage by abrasion or impact. Additionally, the cover substrate 108 may provide a suitable location for marking the coupler 100, including, for example, performance specifications/characteristics, port labels, etc.

Vias 114 may be formed through the base substrate 102 from the top surface 106 to the bottom surface 110. The vias 114 may electrically connect respective ends of the pair of microstrips 104 with contact pads 116 formed on the bottom surface 110 of the base substrate 102. For example, each microstrip 104 may have an input end and an output end that is electrically connected with a respective via 114. The vias 114 may electrically connect the input end or output end of one of the microstrips 104 to respective contact pads 116 such that the contact pads 116 act as electrical ports for the coupler 100.

Although not illustrated in FIGS. 1A and 1B, it should be understood that the contact pads 116 may configured for grid array mounting. For example, a conductive material may be disposed on the contacts pads 116 for land grid array or ball grid array type surface mounting. The conductive material may comprise copper, nickel, aluminum, palladium, gold, silver, platinum, lead, tin, alloys of these materials, or any other suitable conductive substance suitable as a solder material. During installation the coupler 100 may be arranged in the desired location and heated such that the solder melts forming electrical connections with the mounting surface (e.g., PCB).

A base ground plane 112 may be formed on the bottom surface 110 of the base substrate 102. As such, the base ground plane 112 may be spaced apart from the microstrips 104 by the thickness (represented by $T_s$ in FIG. 1A) of the base substrate 102. The base ground plane 112 may be generally parallel with the microstrips 104. The thickness of the base substrate 102 may be selected to produce the desired shielding effect on the microstrips 104 and/or selected to produce the desired response characteristics of the coupler 100.

The base ground plane 112 may be located between the vias 114 in the longitudinal direction 103 (or lateral direction 105) such that the contact pads 116 are adjacent corners of the base ground plane 112. Additionally, in some embodiments, the base ground plane 112 may extend substantially all of the length or width of the base substrate 102. For example, the base ground plane 112 may be sized such that the ground plane 112 can extend between contact pads 116 without directly contacting the contact pads 116. For example, in some embodiments, the ground plane 112 may extend substantially to an edge of the bottom surface 110 of the base substrate 102. This may provide a larger surface by which the coupler 100 can be surface mounted, thereby providing a more mechanically robust attachment.

Figure 2A:
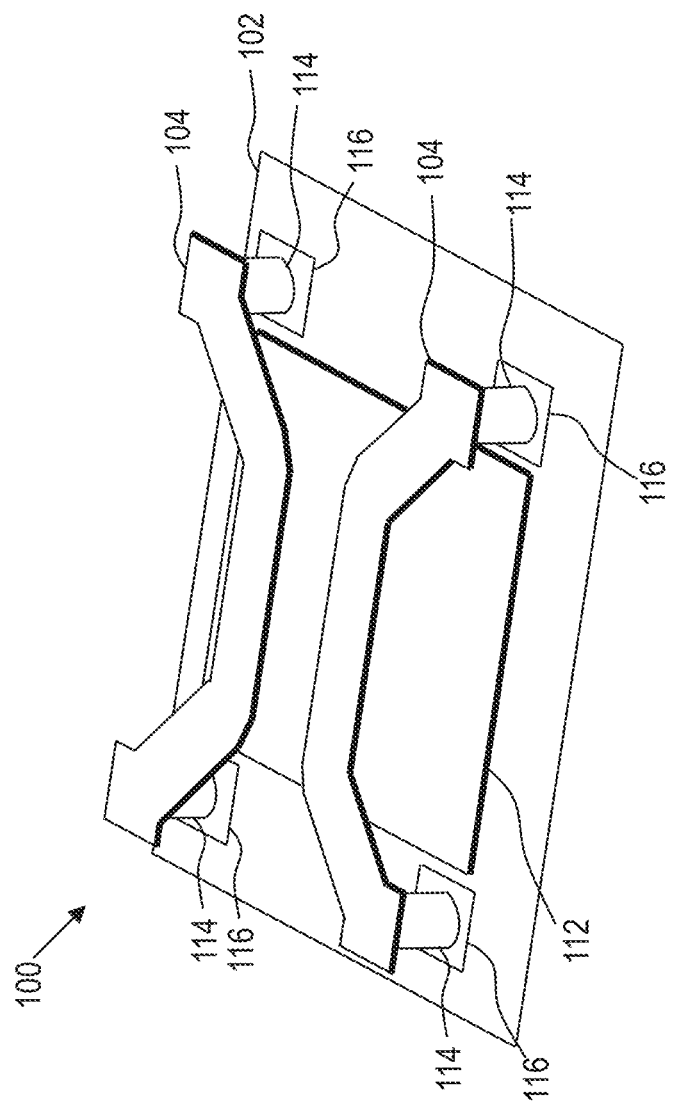

FIGS. 2A and 2B illustrate perspective views of the embodiment of the thin film coupler described above with reference to FIGS. 1A and 1B. The cover substrate 108 is omitted for clarity. Only the bottom surface of the base substrate 102 is shown for clarity.

Figure 3A:
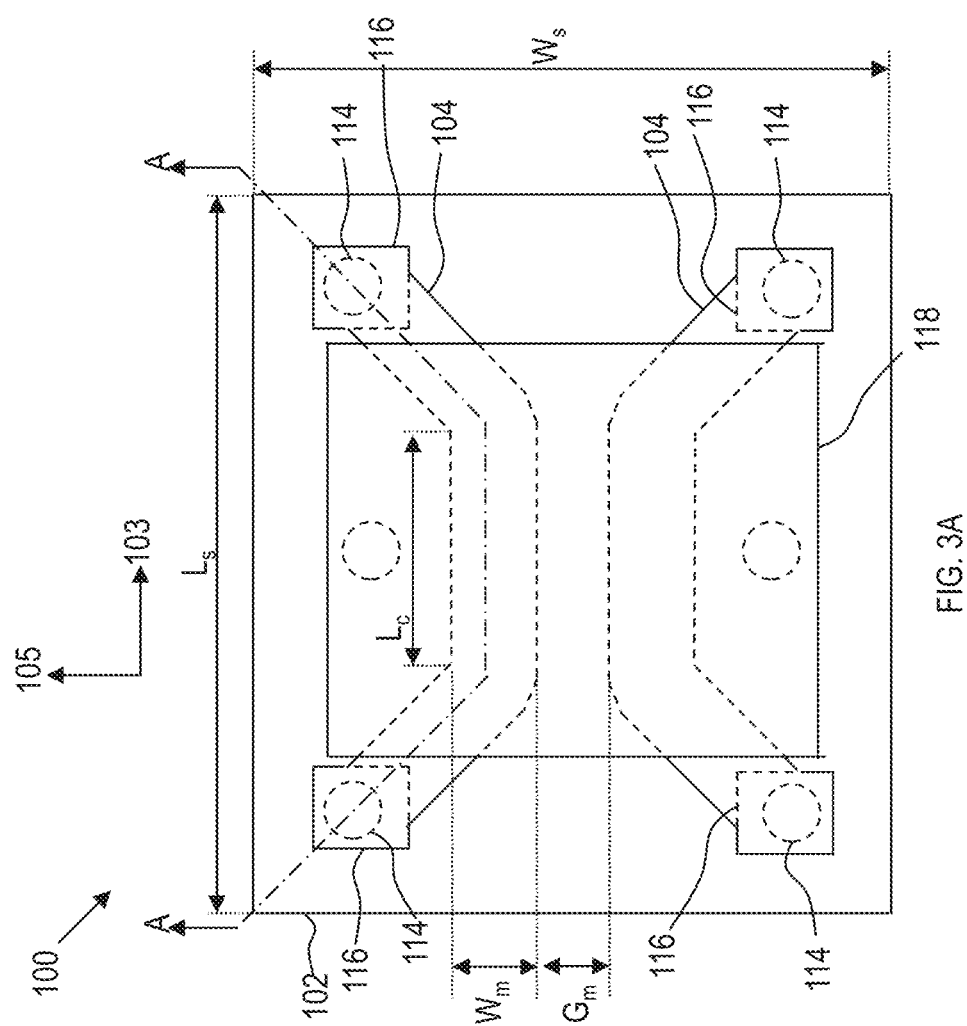
FIG. 3A illustrates a top down view of another embodiment of a thin film coupler including a cover ground plane according to aspects of the present disclosure.
Figure 3B:
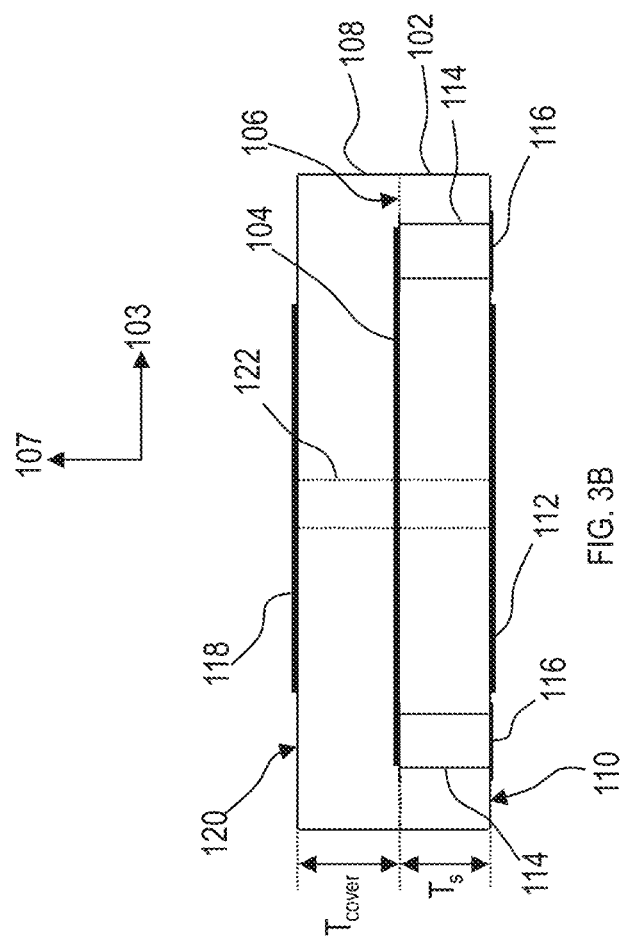
FIG. 3B illustrates a section view along section A-A in FIG. 3A.
Figure 3C:
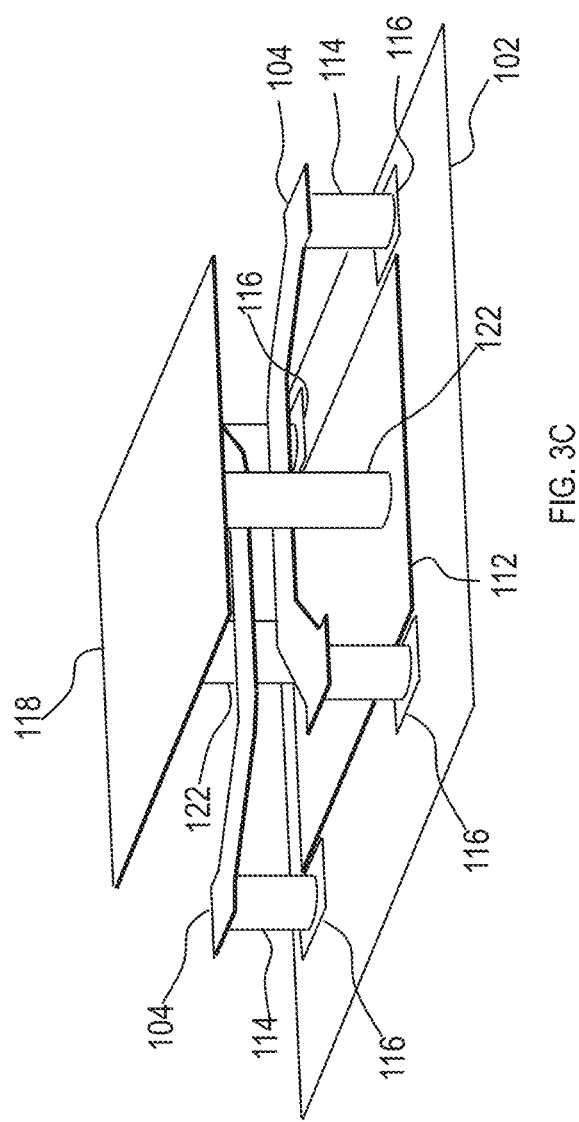
FIG. 3C illustrates a perspective view of the embodiment of the thin film coupler illustrated in FIGS. 3A and 3B.

FIG. 3A illustrates a top down view of another embodiment of a thin film coupler 100 including a cover ground plane 118, according to aspects of the present disclosure. The cover substrate 108 is omitted for clarity. FIG. 3B illustrates a section view along section A-A in FIG. 3A. FIG. 3C illustrates a perspective view in which the cover substrate 108 is omitted for clarity. Only the bottom surface 110 of the base substrate 102 is shown.

The coupler 100 may generally be configured as described above with reference to FIGS. 1A, 1B, 2A, and 2B. In addition, the coupler 100 may include the cover ground plane 118, which may be formed on the top surface 120 of the cover substrate 108. The cover substrate 108 may have a thickness (represented in FIG. 3B as $T_{cover}$) in the Z direction 107. As such, the cover ground plane 118 may be spaced apart from the microstrips 104 in the Z direction 107 by the thickness of the cover substrate 108. The cover ground plane 118 may be generally parallel with the microstrips 104 and/or the base ground plane 112. The thickness of the cover substrate 108 may be selected to produce the desired shielding effect on the microstrips 104 and/or selected to produce the desired response characteristics of the coupler 100.

The cover ground plane 118 may be electrically connected with the base ground plane 112 in a variety of ways. For example, in some embodiments, one or more ground vias 122 may extend through the base substrate 102 and the cover substrate 108 and electrically connect the cover ground plane 118 with the base ground plane 112. For example, a pair of ground vias 122 may be symmetrically arranged on either side of the microstrips 104. In other embodiments, a single ground via 122 may electrically connect the cover ground plane 118 with the base ground plane 112.

In other embodiments, however, the cover ground plane 118 may be electrically connected through a side wall connection, castellation type connection, or any other suitable type of electrical connection to the base ground plane 112 and/or the bottom surface 110 of the base substrate 102. For example, a side wall connection may be formed that extends from the cover ground plane 118 to the base ground plane 112 or the bottom surface 110 of the base substrate 102. The side wall connection may be formed by sputtering or any other suitable deposition technique on a surface of the base substrate 102 and/or cover substrate 108 that extends in the Z direction 107. As another example, a castellation type connection may be formed by drilling holes in the substrates 102, 108 along dicing lines before the substrates 102, 108 are diced along the dicing lines to form individual couplers 100. A conductive layer may be formed on the resulting castellation surface using sputtering or any other suitable deposition technique.

The cover ground plane 112 may provide several advantages. For example, the cover ground plane 112 may provide additional electromagnetic shielding of the microstrips 104. This may reduce the amount of electromagnetic interference from ambient radio waves, for example.

It should be understood that additional combinations and variations are possible based on the disclosed embodiments. For example, the coupler may be partially configured for grid array-type mounting. For instance, a single via or a pair of vias may connect one or two ends of the microstrips with respective contact pads on the bottom surface of the base substrate. The other ends of the microstrips may be electrically connected using any other suitable means, including conductive castellations, soldered wires, etc.

Figure 4:
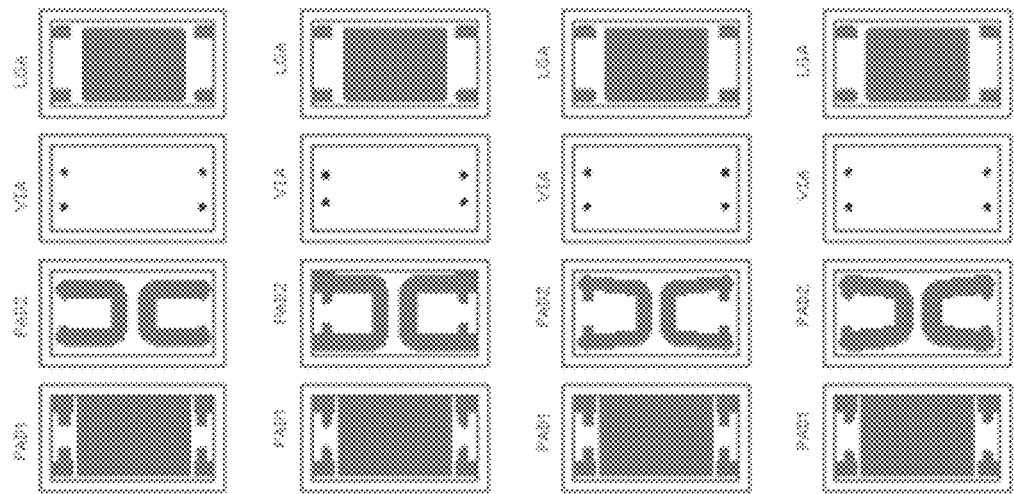
FIG. 4 illustrates diagrammatic views of various surfaces of several embodiments of the coupler in accordance with aspects of the present disclosure.
Figure 4:
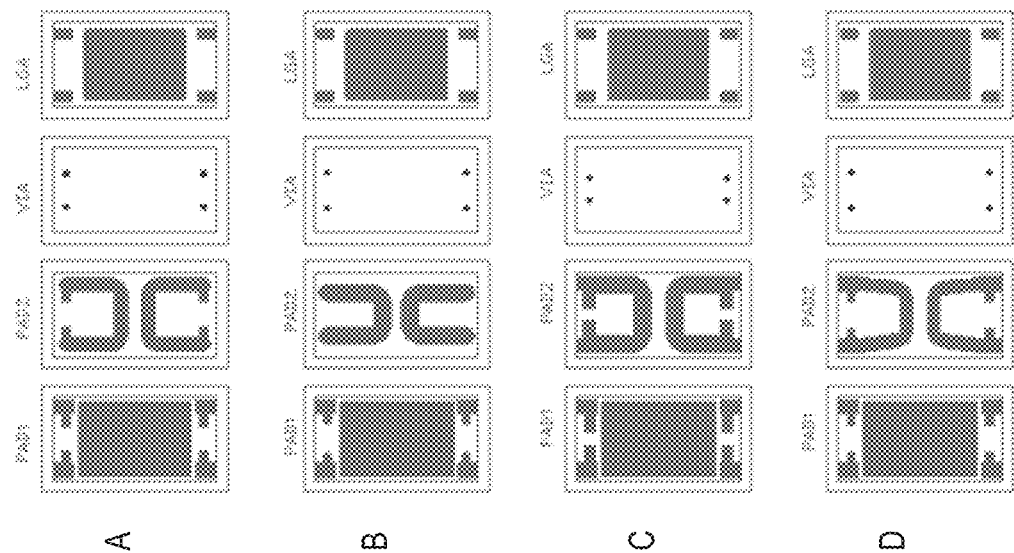

FIG. 4 illustrates diagrammatic views of various surfaces of several embodiments of the coupler in accordance with aspects of the present disclosure. For each embodiment, labeled A-H, the shaded portions of "PAD1" represent thin film layers on the bottom surface of the base substrate that form the base ground plane and contact pads. The shaded portions of "PAD2" represent thin film layers on the top surface of the base substrate that form the microstrips. "VIA" illustrates the locations of the vias in the base substrate. The shaded portions of "LGA" illustrate the shapes of a layer of conductive material formed over the base ground plane and contact pads to facilitate land grid array-type surface mounting of the coupler.

Figure 5:
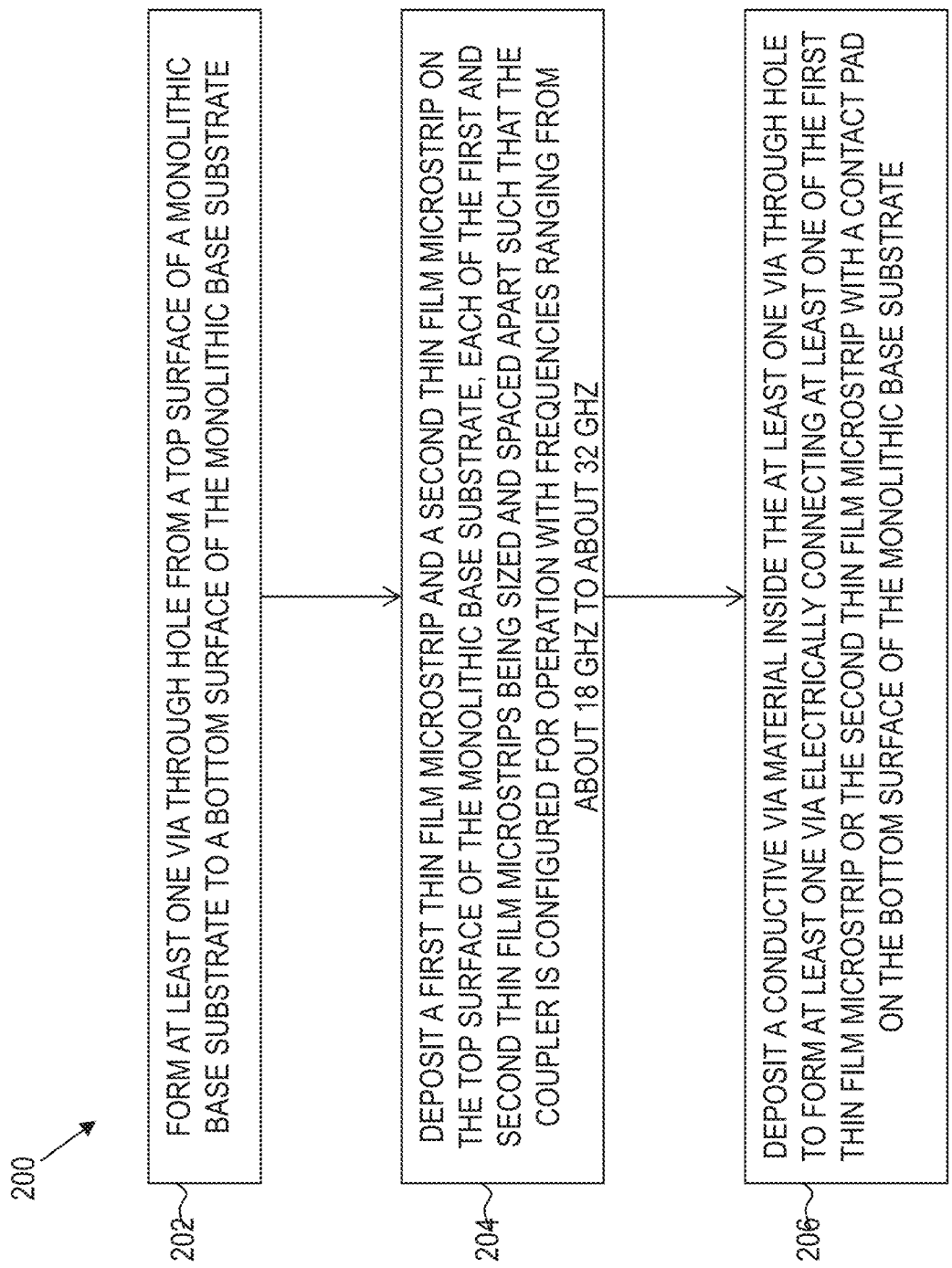
FIG. 5 illustrates a flow diagram of a method for making a high frequency coupler configured for array-type surface mounting in accordance with aspects of the present disclosure.

Referring to FIG. 5, aspects of the present disclosure are directed to a method 200 for making a high frequency coupler configured for array type surface mounting. In general, the method 200 will be described herein with reference to the thin film coupler 100 described above with reference to FIGS. 1-3. However, it should be appreciated that the disclosed method 200 may be implemented with any suitable thin film coupler. In addition, although FIG. 5 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

Referring to FIG. 5, the method 200 may include, at (202), forming at least one via through hole that extends from a top surface of a monolithic base substrate to a bottom surface of the monolithic base substrate. For example, the through hole(s) may be formed using laser drilling or any other suitable method. Additionally, it should be understood that multiple couplers may be formed on a base substrate sheet, which may be diced to form individual couplers.

The method may include, at (204), depositing a first thin film microstrip and a second thin film microstrip on a top surface of a monolithic base substrate. For example, in some embodiments, an additive technique (e.g., sputtering, electroless plating, etc.) may be used to form a layer of suitable thickness of a conductive metal on the base substrate. A lithographic screen may be deposited over the conductive metal layer. Portions of the copper layer may then be removed using any suitable etching technique to produce the desired pattern for the microstrips. A second etching step may then be used to remove the lithographic screen. A variety of suitable etching techniques may be used, including dry etching using a plasma of a reactive gas (e.g., oxygen, chlorine, boron trichloride).

Each of the first and second thin film microstrips may be sized and spaced apart to provide the desired performance characteristics. For example, the coupler may have a coupling factor that is greater than about −30 dB from about 18 GHz to about 32 GHz and/or have a coupling factor that is greater than about −30 dB at about 28 GHz. The coupling length (represented by $L_c$ in FIG. 1A) along which the microstrips are substantially parallel to each other may be sized to produce the desired characteristics. For example, in some embodiments, this length may be equal to about λ/4 or λ/8, where λ represents the desired operating frequency of the coupler (e.g., 28 GHz), as discussed above.

The method may include, at (206), depositing a conductive via material inside the at least one via through hole to form at least one via electrically connecting at least one of the first thin film microstrip or the second thin film microstrip with a contact pad on the bottom surface of the monolithic base substrate. For example, in some embodiments, depositing the conductive via material may include sputtering, electroless plating, or any other suitable thin film deposition process. In some embodiments, this may be performed concurrently with the deposition of the microstrips, at (204).

In some embodiments, the method 200 may also include forming a base ground plane on a bottom surface of the monolithic base substrate. The base ground plane may be formed in a similar manner as described above regarding forming the microstrips, at (204). In some embodiments, the base ground plane may be formed during the same thin film formation steps (e.g., deposition, lithography, etching) described above that may be used to form the microstrips, at (204). In some embodiments, the method 200 may also include forming a layer of conductive material (e.g., solder, tin, lead, gold, alloys thereof or any other suitable conductive material) over the base ground plane and/or contact pads on the bottom surface of the monolithic base substrate that is suitable for grid array-type mounting.

FIG. 6A illustrates a diagrammatic view of an embodiment of a coupler 300 having a transmission line 302 and a coupled line 304. Signal may be input at port 1 and directly transmitted to port 2 of the transmission line 302. The coupler 300 produces a coupled signal in the coupled line 304 at port 3. Port 4 is often grounded.

Figure 6B:
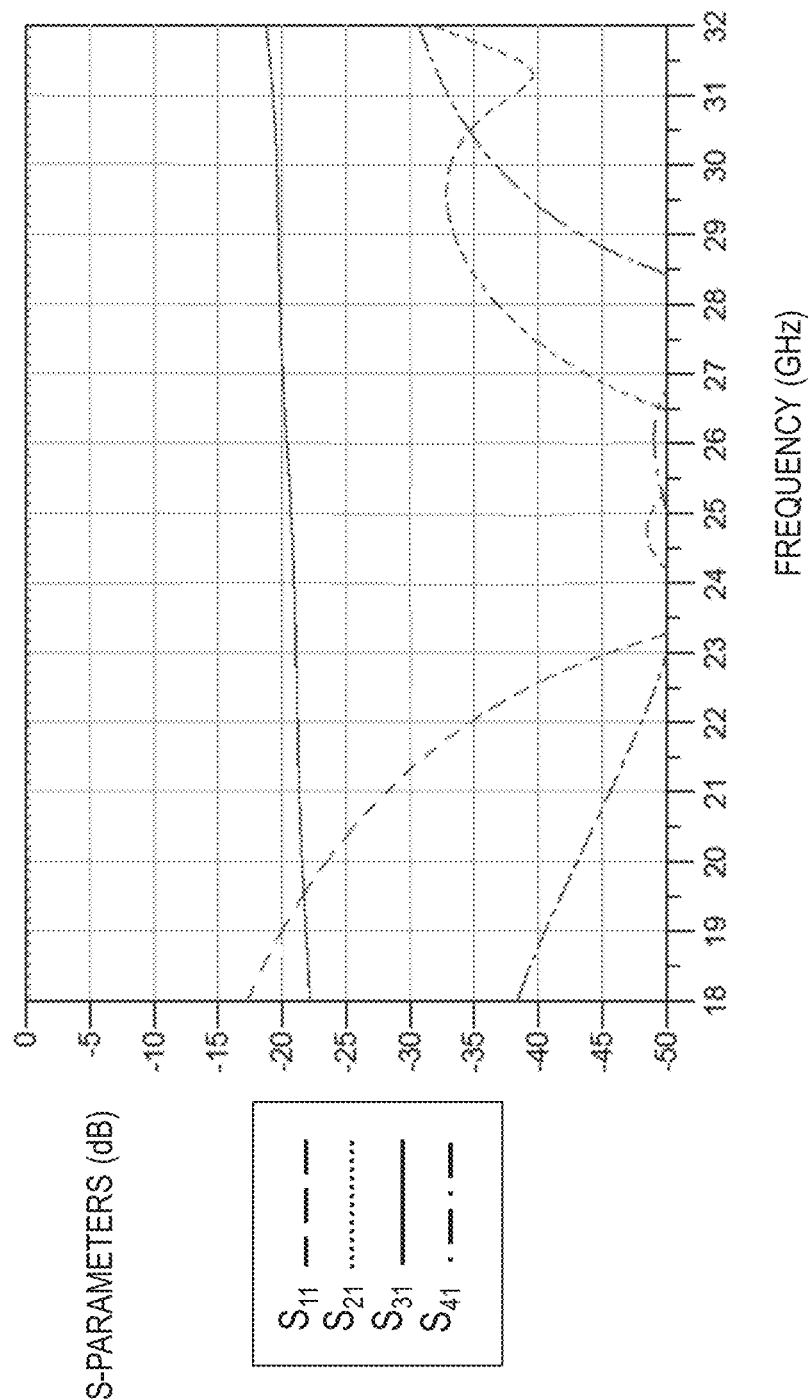
FIG. 6B represents theoretically calculated S-parameters for an embodiment of a coupler in accordance with aspects of the present disclosure across a frequency range extending from 18 GHz to 32 GHz.

FIG. 6B represents theoretically calculated S-parameters for an embodiment of a coupler in accordance with aspects of the present disclosure across a frequency range extending from 18 GHz to 32 GHz. As is understood in the art, the S-parameters are expressed with subscripts in the following form: $S_{ab}$. The subscript values, a and b, indicate port numbers associated with the S-parameter such that each S-parameter can understood to represent the signal resulting at port a as a result of signal input at port b. As is understood in the art, the S-parameters are commonly referred to as follows:

| S-Parameter | Name |
| --- | --- |
| $S_{11}$ | Return Loss |
| $S_{21}$ | Insertion Loss |

| S-Parameter | Name |
| --- | --- |
| $S_{31}$ | Coupling Factor |
| $S_{41}$ | Isolation Factor |

Referring to FIG. 4B, the theoretical coupling factor, $S_{31}$, is greater than about −30 dB from about 18 GHz to about 32 GHz, and in some embodiments, greater than about −25 dB from about 18 GHz to about 32 GHz. The theoretical coupling factor at 28 GHz is −19.84 dB, which is greater than −20 dB.

Additionally, the theoretical return loss, $S_{11}$, is less than about −30 dB from about 22 GHz to about 32 GHz. The theoretical return loss, $S_{11}$, is also less than −15 dB from about 18 GHz to about 32 GHz. A low return loss is generally desirable because return loss represents the portion of the signal that is reflected back to the source port (Port 1).

The insertion loss, $S_{21}$, is greater than about −0.75 dB from about 18 GHz to about 32 GHz. An insertion loss close to zero indicates that the magnitude of the signal is substantially unaffected at Port 2 as a result of the coupler. Lastly, the theoretical isolation factor, $S_{41}$, is less than about −30 dB from about 18 GHz to about 32 GHz, and less than about −45 dB from about 22 GHz to about 28.5 GHz. Application The disclosed coupler may find particular application in a circuit of a base station that is adapted for 5G frequencies or associated instrumentation or equipment. Additional applications can include smartphones, signal repeaters (e.g., small cells), relay stations, radar, radio frequency identification (RFID) devices, and any other suitable device that employs high frequency radio signals.

The base station circuit may be configured to transmit, receive, or otherwise process 5G radio signals. The base station circuit may include a signal source component, such as a radio frequency transmitter, receiver, or component thereof (e.g., mixer, amplifier, modulator, etc.). The coupler may be operatively connected with the signal source component. The coupled line may be used to provide a coupled signal to a separate component (e.g., for monitoring or control of the signal source component). For example, the coupled line may provide a coupled signal to a feedback control loop associated with an amplifier of a radio frequency transmitter.

EXAMPLE

The ability to form a compact, high frequency coupler having a coupling factor of greater than about −30 dB at about 28 Ghz and that is suitable for grid array surface mounting was demonstrated.

As is known in the art, the case size of electronic devices may be expressed as a four digit code (e.g., 2520), in which the first two digits are the length of the device in millimeters (or in hundredths of an inch) and the last two digits are the width of the device in millimeters (or in hundredths of an inch). Common metric case sizes may include 2012, 1608, and 0603.

A 3216 metric case size (1206 imperial case size) coupler was produced. The coupler (and base substrate) have a length of about 3.2 mm (0.125 inch) and a width of about 1.6 mm (0.06 inch). Referring back to FIG. 1A, the coupling length (represented by $L_c$) is about 1.25 mm. The gap (represented by $G_m$ in FIG. 1A) formed between the microstrips is about 500 micrometers. The width (represented by $W_m$ in FIG. 1A) of the microstrips is about 254 micrometers. The vias are about 300 micrometers in diameter. The microstrips and base ground plane are each about 3 micrometers thick. The base substrate is about 254 micrometers thick.

Coupling, return loss, insertion loss, and directivity were measured from 27.2 GHz to 29.8 GHz:

TABLE 1

S-Parameters for 3216 metric case size
(1206 imperial case size) coupler

| Frequency (GHz) | Coupling (dB) | Return Loss (dB) | Insertion Loss (dB) | Directivity (dB) |
|---|---|---|---|---|
| 27.2 | −18.9 | −14.2 | −0.32 | 13.5 |
| 27.6 | −19.3 | −17.1 | −0.53 | 16.3 |
| 28 | −18.8 | −21.2 | −0.36 | 19.9 |
| 29 | −18.2 | −19.6 | −0.16 | 18.7 |

As shown in Table 1, the 1206 imperial case size coupler has a coupling factor that is −19.84 dB at 28 GHz, which is greater than about −30 dB.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A high frequency, surface mountable coupler comprising:
   a monolithic base substrate having a top surface, a bottom surface, a length in a longitudinal direction, and a width in a lateral direction that is perpendicular to the longitudinal direction;
   a first thin film microstrip disposed on the top surface of the monolithic base substrate, the first microstrip having an input end and an output end;
   a second thin film microstrip disposed on the top surface of the monolithic base substrate, the second microstrip having an input end and an output end; and
   at least one via extending through the monolithic base substrate from the top surface to the bottom surface of the monolithic base substrate, the at least one via electrically connected with at least one of the input end or the output end of the first microstrip or the second microstrip;
   four contact pads disposed on the bottom surface of the base substrate, and wherein the at least one via comprises:
      a first via electrically connecting the input end of the first thin film microstrip to a first of the four contact pads;
      a second via electrically connecting the output end of the first thin film microstrip to a second of the four contact pads;
      a third via electrically connecting the input end of the second thin film microstrip to a third of the four contact pads; and
      a fourth via electrically connecting the output end of the second thin film microstrip to a fourth of the four contact pads;
   wherein the coupler has a coupling factor that is greater than about −30 dB at about 28 GHz.

2. The coupler of claim 1, wherein the coupler has a coupling factor that is greater than about −30 dB from about 10 GHz to about 70 GHz.

3. The coupler of claim 1, further comprising at least one contact pad disposed on the bottom surface of the base substrate, the at least one contact pad electrically connected with the at least one via.

4. The coupler of claim 1, further comprising a base ground plane disposed on the bottom surface of the monolithic base substrate.

5. The coupler of claim 1, wherein each of the length and the width of the base substrate is less than about 7 mm.

6. The coupler of claim 1, wherein the coupler is configured for grid array type mounting.

7. The coupler of claim 1, wherein the base substrate comprises a ceramic material.

8. The coupler of claim 1, wherein the base substrate comprises sapphire.

9. The coupler of claim 1, further comprising a cover substrate arranged on the top surface of the base substrate.

10. The coupler of claim 9, further comprising a cover ground plane disposed on a top surface of the cover substrate.

11. The coupler of claim 9, wherein the cover ground plane is electrically connected with the base ground plane.

12. The coupler of claim 11, wherein the at least one via comprises a ground via extending through each of the base substrate and the cover substrate, the ground via electrically connecting the cover ground plane with the base ground plane.

13. The coupler of claim 1, wherein the at least one via comprises a pair of vias, and wherein the base ground plane extends between the pair of vias in one of the longitudinal or lateral directions.

14. The coupler of claim 1, further comprising a polymeric protective layer exposed along an exterior of the coupler.

15. The coupler of claim 1, further comprising an adhesion layer in contact with at least one of the first thin film microstrip or the second thin film microstrip.

16. A method for forming a high frequency, surface mountable coupler, the method comprising:
   forming at least one via through hole that extends from a top surface of a monolithic base substrate to a bottom surface of the monolithic base substrate;
   depositing a first thin film microstrip and a second thin film microstrip on the top surface of the monolithic base substrate, each of the first and second thin film microstrips being sized and spaced apart such that the coupler has a coupling factor that is greater than about −30 dB at about 28 GHz;
   forming four contact pads on the bottom surface of the base substrate; and
   depositing a conductive via material inside the at least one via through hole to form at least one via electrically connecting at least one of the first thin film microstrip or the second thin film microstrip with a contact pad on the bottom surface of the monolithic base substrate wherein depositing the conductive via material inside the at least one via through hole to form the at least one via comprises:
      forming a first via electrically connecting the input end of the first thin film microstrip to a first of the four contact pads;

forming a second via electrically connecting the output end of the first thin film microstrip to a second of the four contact pads;

forming a third via electrically connecting the input end of the second thin film microstrip to a third of the four contact pads: and forming a fourth via electrically connecting the output end of the second thin film microstrip to a fourth of the four contact pads.

17. The method of claim 16, further comprising forming a base ground plane on a bottom surface of the monolithic base substrate.

18. The method of claim 16, wherein forming the at least one via through hole comprises laser drilling the at least one via through hole.

19. The method of claim 16, further comprising arranging a cover substrate on top of the top surface of the base substrate.

20. The method of claim 19, further comprising depositing a cover ground plane on a top surface of the cover substrate.

21. The method of claim 16, further comprising forming at least one ground via through hole that extends from the top surface of the cover substrate to the bottom surface of the base substrate.

22. A high frequency, surface mountable coupler comprising:
- a monolithic base substrate having a top surface, a bottom surface, a length in a longitudinal direction, a width in a lateral direction that is perpendicular to the longitudinal direction, and a thickness in a Z direction that is perpendicular to each of the longitudinal direction and the lateral direction;
- a first thin film microstrip disposed on the top surface of the monolithic base substrate, the first microstrip having an input end and an output end;
- a second thin film microstrip disposed on the top surface of the monolithic base substrate, the second microstrip having an input end and an output end; and
- four contact pads disposed on the bottom surface of the base substrate, and wherein the at least one via comprises:
  - a first via electrically connecting the input end of the first thin film microstrip to a first of the four contact pads;
  - a second via electrically connecting output end of the first thin film microstrip to a second of the four contact pads;
  - a third via electrically connecting the input end of the second thin film microstrip to a third of the four contact pads; and
  - a fourth via electrically connecting the output end of the second thin film microstrip to a fourth of the four contact pads;

wherein at least a portion of the first thin film microstrip and at least a portion of the second thin film microstrip extend parallel to each other in a first direction along a coupling length, and wherein the coupling length ranges from about 0.2 mm to about 3.8 mm.

23. The coupler of claim 22, wherein each of the first thin film microstrip and the second thin film microstrip have respective widths in a second direction that is perpendicular to the first direction, and each of the widths of the first and second thin film microstrips range from about 50 micrometers to about 500 micrometers.

24. A base station circuit comprising:
- a signal source component;
- a high frequency, surface mountable coupler operatively connected with the signal source component, the coupler comprising:
  - a monolithic base substrate having a top surface, a bottom surface, a length in a longitudinal direction, and a width in a lateral direction that is perpendicular to the longitudinal direction;
  - a first thin film microstrip disposed on the top surface of the monolithic base substrate, the first microstrip having an input end and an output end;
  - a second thin film microstrip disposed on the top surface of the monolithic base substrate, the second microstrip having an input end and an output end; and
  - at least one via extending through the monolithic base substrate from the top surface to the bottom surface of the monolithic base substrate the at least one via electrically connected with at least one of the input end or the output end of the first microstrip or the second microstrip;
  - four contact pads disposed on the bottom surface of the base substrate. and wherein the at least one via comprises:
    - a first via electrically connecting the input end of the first thin film microstrip to a first of the four contact pads;
    - a second via electrically connecting the output end of the first thin film microstrip to a second of the four contact pads;
    - a third via electrically connecting the input end of the second thin film microstrip to a third of the four contact pads; and
    - a fourth via electrically connecting the output end of the second thin film microstrip to a fourth of the four contact pads;
  - wherein the coupler has a coupling factor that is greater than about −30 dB at about 28 GHz.

* * * * *